United States Patent [19]

Metsler

[11] Patent Number: 5,165,055
[45] Date of Patent: Nov. 17, 1992

[54] METHOD AND APPARATUS FOR A PCB AND I/O INTEGRATED ELECTROMAGNETIC CONTAINMENT

[75] Inventor: Alexander Metsler, Newton, Mass.

[73] Assignee: Digital Equipment Corporation, Maynard, Mass.

[21] Appl. No.: 723,151

[22] Filed: Jun. 28, 1991

[51] Int. Cl.5 .......................... H04B 3/28; H03H 7/00
[52] U.S. Cl. ..................................... 333/12; 333/185; 333/181; 361/392; 361/399
[58] Field of Search ..................... 333/12, 181, 185, 1, 333/182, 246; 174/52; 361/392, 399, 424, 415

[56] References Cited

U.S. PATENT DOCUMENTS

| | | | |
|---|---|---|---|
| 3,681,612 | 8/1972 | Vogl et al. | 333/12 X |
| 4,560,962 | 12/1985 | Barrow | 333/1 |
| 4,622,527 | 11/1986 | Carlson | 333/182 |
| 4,641,224 | 2/1987 | Reimer | 361/424 |
| 4,658,334 | 4/1987 | McSparran et al. | 361/415 |
| 4,739,453 | 4/1988 | Kurokawa | 361/424 |
| 4,827,378 | 5/1989 | Gillan et al. | 361/424 |
| 4,868,716 | 9/1989 | Taylor et al. | 361/424 |
| 4,904,968 | 2/1990 | Theus | 333/246 |
| 4,954,929 | 9/1990 | Baran | 333/12 X |
| 4,970,625 | 11/1990 | Belanger et al. | 361/424 |

Primary Examiner—Eugene R. LaRoche
Assistant Examiner—Ali Neyzari
Attorney, Agent, or Firm—Dirk Brinkman; Barry Young; Ronald E. Myrick

[57] ABSTRACT

An integrated electromagnetic and radio frequency interference (EMI/RFI) shielding apparatus contains EMI/RFI produced by a computer system. In particular the apparatus isolates input/output (I/O) connectors of the computer system from EMI/RFI produced by noisy components of the system. The shielding apparatus comprises a printed circuit board (PCB) partitioned into two electromagnetically isolated zones separated by a non-conducting void. Components that are EMI/RFI producers, such as the CPU and clock, are mounted in a first zone, and components which need to be isolated, such as input/output connectors are mounted in a second zone. The various conducting layers in the PCB are arranged and filtered to inhibit EMI/RFI propagation to the I/O connectors. Additionally, the I/O connectors are isolated from EMI/RFI by a secondary EMI/RFI shield.

17 Claims, 6 Drawing Sheets

METHOD AND APPARATUS FOR A PCB AND I/O INTEGRATED ELECTROMAGNETIC CONTAINMENT

FIELD OF THE INVENTION

This invention relates to electromagnetic and radio frequency interference containment and is more particularly concerned with isolating sources of such interference from transmitters in computer systems.

BACKGROUND OF THE INVENTION

Rapid advances in the electronic industry, triggered by the use of very large scale integration (VLSI) components, have created new problems in electromagnetic interference and radio frequency interference (EMI/RFI) containment. Computer system using VLSI chips and reduced instruction set computer (RISC) architectures may realize short instruction cycles by using high frequency clocks. Clock frequencies in the range of 100 MHz to 200 MHz are now common in high performance computers. Digital circuits operating at these frequencies may have pulse rise times of less than 2 nanoseconds causing EMI/RFI to be radiated at harmonic frequencies in excess of 2 GHz. EMI/RFI containment problems at high frequencies intensify because the relatively short wavelength radiation "squeeze out" or passes through smaller openings in the equipment enclosure (chassis) and requires more expensive and complex filters on the connectors for cables to peripheral equipment. Minimizing EMI/RFI is one of the most difficult aspects of designing high speed computers. Indeed international and FCC regulations set strict EMI/RFI standards for certain categories of electronic equipment.

The problem of EMI/RFI containment is of particular importance when computer systems incorporating high speed logic, such as desktop personal computers and workstations, are used in an office setting. In such systems, a single printed circuit board (PCB), mounted within a chassis, customarily serves as a so called motherboard. The pins of the various components, such as the power supply, the central processor unit (CPU) chip, high speed logic, memory and option card connectors, attach to power, ground and signal traces etched on the various conducting layers of the PCB. Each system may also have input/output (I/O) interfaces for communicating with peripheral equipment such as printers, and other computer systems. The peripheral equipment is connected to the I/O interface by cables that attach to an I/O connector mounted near the edge of the PCB and partially protruding through the chassis. Although, it is relatively easy to construct a shielded chassis, designing a shielded I/O connector is relatively difficult.

Each I/O connector is a potential transmitter of EMI/RFI. The EMI/RFI is propagated to the I/O connector via the circuits connecting it with the high speed logic. The EMI/RFI is also picked up directly from radio frequency signals radiated by the high speed logic within the chassis environment (near-field electromagnetic radiation). Traditional EMI/RFI containment techniques for an I/O connector have resulted in complex and expensive connector and chassis designs including embedded capacitive filters, shielded cables and pins encased in a metallic housing.

The cost of providing effective non-interfering I/O connectors for high performance systems has recently become a greater proportion of the total system cost. For example, shielded I/O connectors may cost as much as ten times more than comparable off-the-shelf, mass produced, molded plastic connectors. It is desirable that computer systems be easily and economically constructed using low cost, unshielded and unfiltered I/O connectors, without adversely affecting EMI/RFI containment.

SUMMARY OF THE INVENTION

The invention, improves electromagnetic interference and radio frequency interference (EMI/RFI) containment in a computer system by arranging the components mounted on a printed circuit board (PCB) of the computer system in electromagnetically isolated zones.

Components which are sources or propagators of EMI/RFI, such as the central processor unit (CPU) and high speed logic, are mounted in a first "EMI/RFI zone." Components which are potential transmitters of EMI/RFI, such as input/output (I/O) connectors, are mounted in a second, relatively electromagnetically noiseless, "I/O zone."

EMI/RFI protection of the components in the I/O zone is achieved by electromagnetically isolating the circuit traces etched on the conducting layers of the PCB in the EMI/RFI zone from the traces etched on the conducting layers in the I/O zone. All conducting layers in the PCB have a vertically aligned separation zone, void of circuit traces, the separation zone forming the boundary between the I/O and EMI/RFI zones. All components mounted in the EMI/RFI zone, including components which are potential sources of EMI/RFI, are directly connected only to traces in the EMI/RFI, and likewise the components in the I/O zone, some of which may be potential transmitters of EMI/RFI, are directly connected only to the traces in the I/O zone.

Any electrical connection between traces in the two zones is only by means of filter circuits which provide a high impedance to EMI/RFI. In the I/O zone, all conductive layers used for signaling are sandwiched between at least two ground planes in the PCB providing an electromagnetic shield. The I/O connectors are further contained within a secondary electromagnetic shield consisting of a hood, bezel and the ground planes of the PCB. The hood is constructed with a plurality of internal walls defining separate Faraday cages for the various I/O connectors.

In apparatus in accordance with the invention, EMI/RFI from a computer system is minimized by integrating an improved printed circuit board layout with improved shielding, filtering and grounding. A high performance computer system can, thus, be constructed using low cost unfiltered and unshielded I/O connectors without excessive EMI/RFI radiating outside the equipment enclosure.

DETAILED DESCRIPTION OF THE PREFERRED EMBODIMENT

Figure 1:
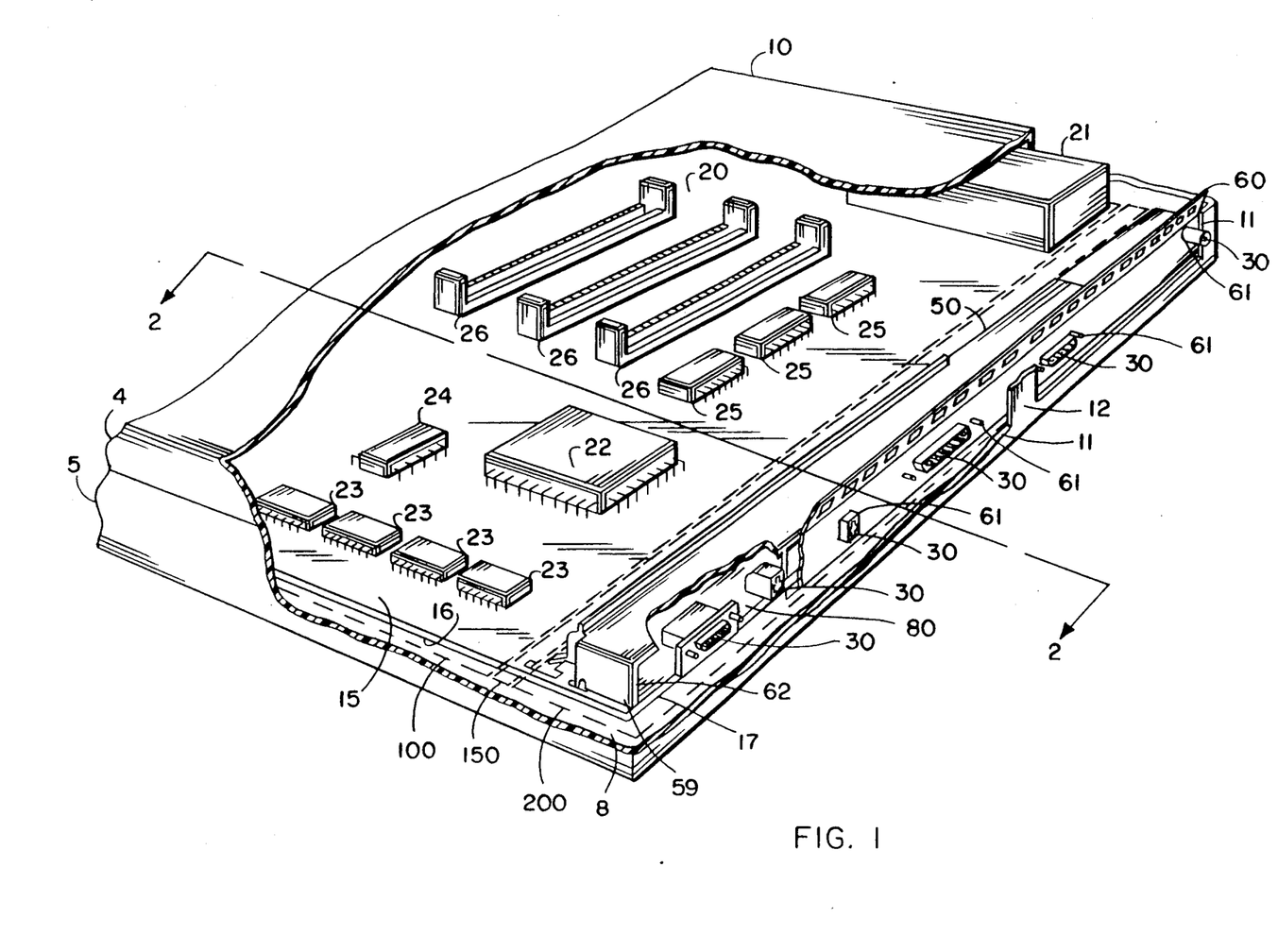
FIG. 1 is a cut-away isometric view of a computer system showing a chassis, a printed circuit board with various components mounted thereon, and a secondary EMI/RFI shield according to the present invention.

Referring now to the drawings, and particularly to FIG. 1, there is shown an equipment enclosure (chassis) 10 of a computer system including a multi-layer printed circuit board (PCB) 20, various electronic components, a hood 50 and a bezel 60.

Some of the components, as described herein, operate at such high frequencies that the components produce electromagnetic interference and radio frequency interference (EMI/RFI) which can interfere with the proper operation of other electrical equipment. The invention contains such EMI/RFI within the chassis 10, and more particularly, electromagnetically isolates those components inside the chassis 10 which are potential transmitters of the harmful EMI/RFI from the components producing the EMI/RFI.

The chassis 10 is a generally box-like structure formed of two molded plastic coated shells, 4 and 5, which snap together to form the chassis 10. The chassis 10 is coated on all interior and exterior surfaces with an electrically conducting metallic substance, by way of example electro-deposited nickel or zinc. The rear portion 12 of the chassis 10 includes cut-outs 11 for external access to the components in the chassis 10. The chassis 10 is also typically constructed with numerous ventilation slits, not shown, for cooling the interior.

The PCB 20, which is generally mounted on the bottom portion 8 of the chassis 10, has a top surface 15 for mounting the various components, a bottom surface 16 and a rear edge 17. The PCB 20, generally rectangularly shaped, includes alternating layers of electrically conducting and electrically insulating materials.

The PCB 20 is partitioned into three distinct zones generally indicted by the broken lines 100, 150 and 200 in FIG. 1. The first zone 100, hereinafter the "EMI/RFI zone," is used for mounting the various components and circuits that are producers of EMI/RFI. Components and circuits that are potential transmitters of EMI/RFI are confined to a second electromagnetically isolated zone 200, hereinafter the "I/O zone." The separation between the EMI/RFI zone 100 and the I/O zone 200 is effected, in part, by the third boundary or "separation zone" 150.

Mounted on the top surface 15 of the PCB 20, in the general area of the EMI/RFI zone 100, are the various electrical components typically found in a computer system which are potential producers of EMI/RFI. Shown in FIG. 1 are a power supply 21, a central processor unit (CPU) 22, memory chips 23, a high frequency clock 24, high speed logic circuits 25 and edge connectors 26 for mounting option cards, not shown.

Also mounted on the top surface 15 of the PCB 20, in the general area of the I/O zone 200, adjacent to the rear edge 17 of the PCB 20, are the various components which are likely transmitters of EMI/RFI produced by the components in the EMI/RFI zone 100. Components which are of particular concern for EMI/RFI containment include input/output (I/O) connectors 30 and associated driver circuits not shown. One of the reasons that the I/O connectors are a particular problem is that the I/O connectors 30 are accessible from outside the chassis 10 through cut-outs 11 in the chassis 10 for the purpose of connecting with I/O cables, not shown.

Figure 6:
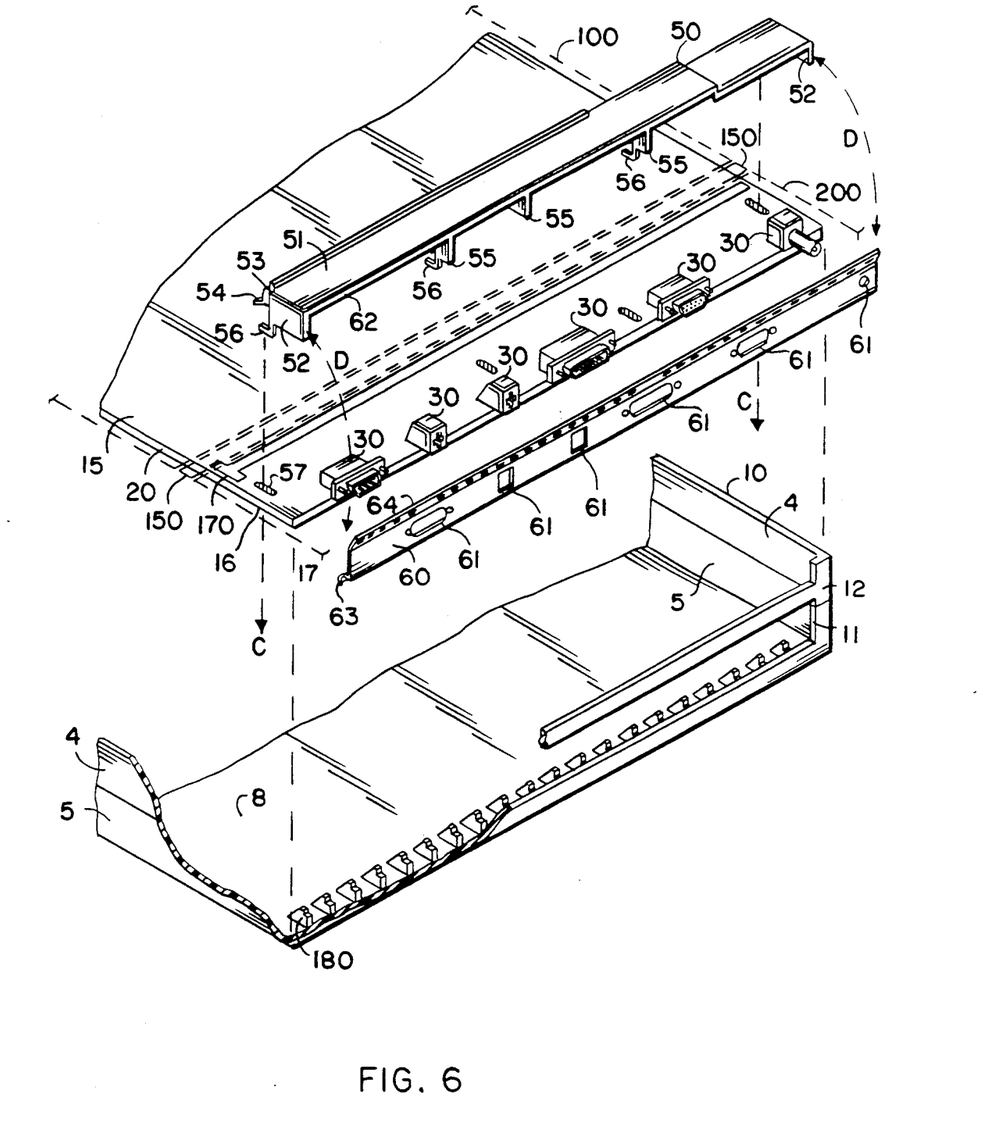
FIG. 6 is an exploded view of the secondary shield for the I/O connectors used with the system of FIG. 1.

The hood 50 and the bezel 60, described in further detail with reference to FIG. 6, are mounted on the top surface 15 of the PCB in the area of the I/O zone 200. The hood 50 consists of molded plastic coated with an electrically conducting material similar to that used for the chassis 10. A bottom edge 59 of the hood 50 is in contact with portions of the top surface 15 of the PCB 20 generally defining the periphery of the I/O zone 200. A rear edge 62 of the hood 50 is arranged to be in the same plane as the rear edge 17 of the PCB 20. The hood 50 is dimensioned to cover the I/O connectors 30.

The bezel 50 is constructed of a generally flat, thin and metallic material, generally flexible and electrically conductive. The bezel 60 is mounted perpendicularly with respect to the plane of the PCB 20. The bezel 60 is arranged to electrically contact the rear edge 62 of the hood 50. Portions of the edge of the bezel 60 are also in electrical contact with the rear portion 12 of the chassis 10. The bezel 60 includes apertures 61 dimensioned to coincide with the rear portions of the connectors 30 which partially protrude therethrough. The hood 50, the bezel 50, and the rear portion of the PCB 20 enclose a cavity 80 in which the I/O connectors 30 and associated driver circuits are positioned.

The chassis 10 provides the necessary mounting structure and enclosure for the PCB 20 and the components mounted thereon. The chassis 10, when grounded by means of the electrically conductive coating on the exterior and interior surfaces, forms a primary EMI/RFI shield or Faraday cage for the PCB 20 and the components. To inhibit EMI/RFI from "leaking" through the chassis 10, the ventilation slits (not shown) are designed with cross-sectional dimensions smaller than the wavelength of the interfering radiation. The bezel 60, the edges of which are in contact with the rear portion 12 of the chassis 10 inhibit radiation leakage through the cut-outs 11.

The PCB 20 provides the mounting structure for the various components. The components are mounted on the PCB 20 conventionally, that is directly by their pins, or indirectly in sockets attached to the PCB 20. The electrically conducting layers in the PCB 20, described in detail with reference to FIGS. 2-5, are used for electrically connecting the various components with one another. That is, the component pins and socket pins are generally soldered to the various conducting layers. Electromagnetic isolation between the EMI/RFI zone 100 and the I/O zone 200 is achieved in part by the removal of all conductive material in the conductive layers in that portion of the PCB 20 which is the separation zone 150.

The operations and functions of the various components mounted on the PCB 20 are conventional and do not require further description herein. However, the components are categorized and segregated according to whether they are producers or transmitters of EMI/RFI. In other words, components that are producers of EMI/RFI, such as the CPU 22, memory 23, clock 24, and high speed logic 25, are only mounted in the EMI/RFI zone 100, and conversely, components that are transmitters of EMI/RFI, such as the I/O connectors 30, are mounted only in the I/O zone 200.

The hood 50 and bezel 60, which are electrically grounded to the PCB 20 and chassis 10, provide a secondary EMI/RFI shield for components mounted in the I/O zone 200. This secondary EMI/RFI shield minimizes the radiation of EMI/RFI, which is generally present within the environment of the chassis 10, to the cavity 80 where the I/O connectors 30 are mounted.

Figure 2:
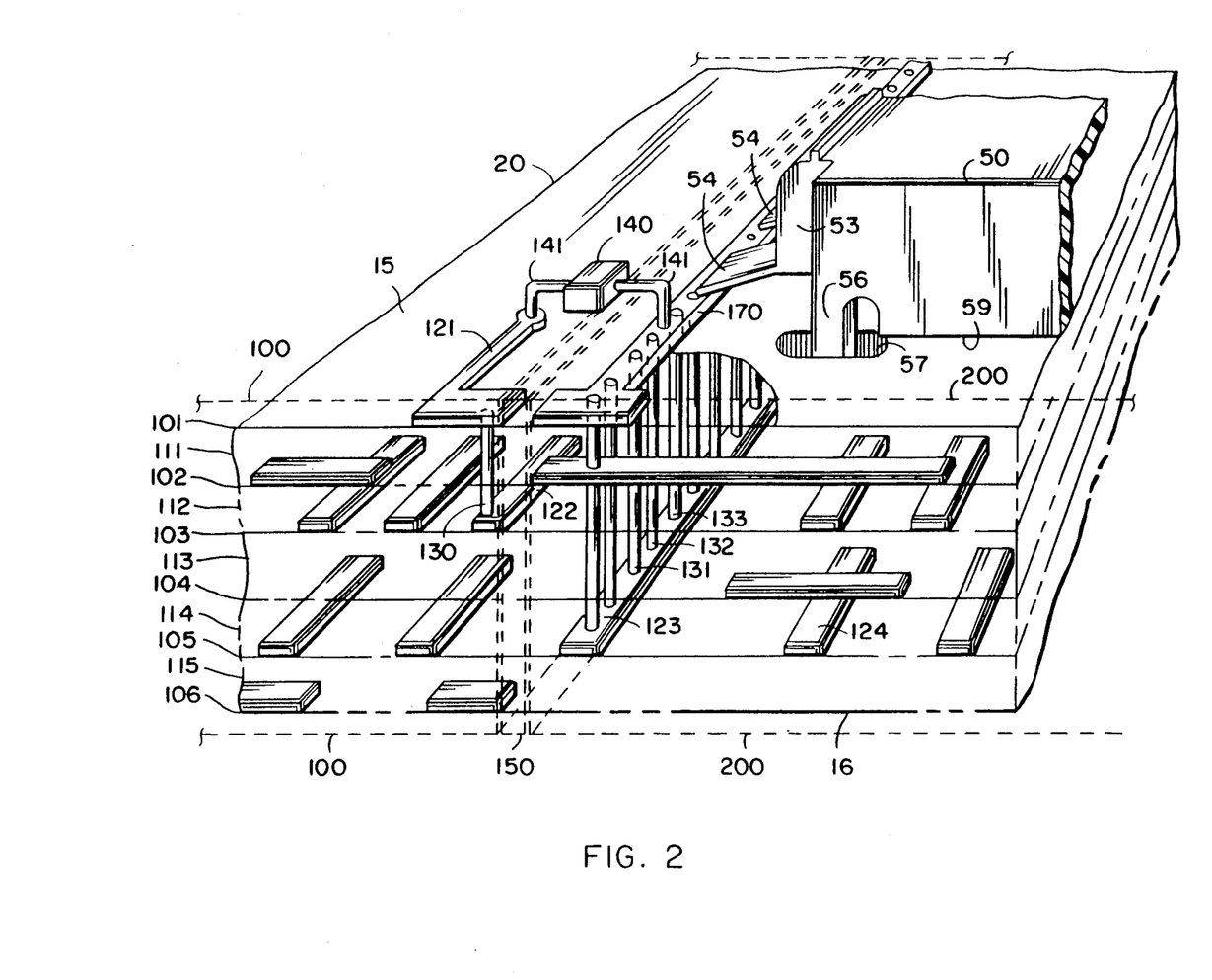
FIG. 2 is an enlarged partially cut-away view of the printed circuit board of the system of FIG. 1, as viewed generally along line 2—2 thereof.

Now with reference to FIG. 2, the internal structure of the PCB 20 and the arrangement of the various components is further described. In FIG. 2 there is shown an enlarged cross-section of the PCB 20, not to scale, taken generally in area 2—2 in FIG. 1. The PCB 20 is constructed with five electrically insulating layers 111–115 bonded to six electrically conducting layers 101–106. That is, the conducting layers 101–106 alternate with the insulating layers 111–115.

The insulating layers 111–115 are constructed of generally rectangular sheets of fiber glass reinforced epoxy. The conducting layers 101–106 are preferable constructed of copper foil. The number of insulating layers 101–105 and conducting layers 111–116 will vary depending on the design of the PCB 20, as further illustrated in FIGS. 3, 4 and 5.

Electrically conducting pathways or "traces," some of which are labeled 121–124 and 170, are positioned on the conducting layers 101–106 for connecting the various components. The traces 121–124 and 170 are formed by conventional etching techniques. Traces in one of the conductive layers 101–106 are generally arranged perpendicular to the traces in the next adjacent conducting layer for simplifying the lay-out of the PCB 20. Components mounted on the top surface 15 of the PCB 20, such as component 140 having pins 141, are connected to the traces (121 and 170) by conventional soldering techniques.

Plated-through holes, or "vias," in the PCB 20, some of which are labeled 130–133, are used for electrically connecting the traces in one layer with those in another. By way of example, via 130 electrically connects trace 121 on conducting layer 101 with trace 122 on conducting layer 103. The vias 131–133, which connect the traces 123 and 170 which outline the periphery of the I/O zone 200, are spaced relatively close together forming a fence-like structure within the PCB 20. In other words, vias 131–133 are the posts and traces 123 and 170 are the top and bottom rails of the fence-like structure.

FIG. 2 also shows the front portion of the hood 50 which is mounted on the top surface 15 of the PCB 20. As is explained further with reference to FIG. 6, the hood 50 has tabs 56 extending vertically down from the bottom portion. The tabs 56 are arranged to engage with slots 57 in the PCB 20. Projecting down at an angle from a front wall 53 of the hood 50 are a plurality of flexible fingers 54, two of which are partially shown in the view of FIG. 2. The fingers 54 are dimensioned and arranged for contacting the trace 170 when the hood 50 is engaged with the PCB 20.

The function of the traces 121–124 and 170 is generally conventional, that is, for electrically connecting the various components with one another. However, the traces 121–124 and 170 may be categorized and segregated according to their EMI/RFI characteristics in a manner similar to that for components, as described above. That is, components which are producers of EMI/RFI connect only with traces located in the EMI/RFI zone 100, such as traces 121 and 122. Conversely, components which are potential transmitters of EMI/RFI, and, thus, need to be protected from EMI/RFI connect only with traces located in the I/O zone 200, such as trace 124. Thus, components and circuits in the EMI/RFI zone 100 are physically and electrically isolated from components and circuits in the I/O zone 200.

The separation zone 150 which forms the boundary between the EMI/RFI and I/O zones 100, 200 does not contain any traces. That is, in the separation zone 150 of the PCB 20, the copper in all of the conductive layers 101–106 is removed, forming a vertically aligned area void of electrically conductive material. By way of example, in the present invention, the width of the separation zone which is void of copper is 0.050 inches (50 mils). Thus, the injection of capacitive coupled noise from traces in the EMI/RFI zone 100 to traces in the I/O zone 200 is minimized.

Any electrical connection between traces in the EMI/RFI zone 100 and traces in the I/O zone 200 is made only through a filter circuit, such as circuit 140, mounted generally above the separation zone 150, as shown in FIG. 2. That is, all signal, power and ground connections between components in the EMI/RFI zones, 100 and 200, are made by means of respective EMI/RFI filter circuits. By way of example, trace 121 is electrically coupled to trace 170 by filter circuit 140. A filter circuit 140 suitable for suppressing the transmission of EMI/RFI, such as circuit 140, includes a ferrite bead (not shown), such as a Tolkin 10 line common mode choke, through which the electrical connection passes and a capacitor (not shown), for example 1000 picofarad, 50 V, coupled to ground on the I/O zone 200 side, forming an L-C circuit, which provides a high impedance to EMI/RFI which may be present in the electrical signals coming from the EMI/RFI zone 100 side of the PCB 20.

The pick-up of EMI/RFI by traces in the I/O zone is further minimized by not providing for any traces on the bottom surface 16 of the PCB 20 in the general area of the I/O zone 200. Thus EMI/RFI which is present within the environment of the chassis 10, and particular in the air space below the PCB 20 is not directly exposed to any electrically conducting material in the PCB 20 in the area of the I/O zone 200.

Additional EMI/RFI protection within the PCB 20 is provided by the fence-like structure of the vias 131–133. The close spacing of the "posts" inhibits the leakage of EMI/RFI laterally within the PCB 20. The vias 131–133 and traces 123, 170 which form the fence-like structure around the periphery of the I/O zone 200 of the PCB 20 are grounded to the chassis 10 and ground planes in the PCB 20. The vias 131–133 also provide a low impedance decoupling mechanism between the various conducting layers and minimize the coupling of EMI/RFI in the PCB 20 with leads and cables external to the PCB 20.

Pick-up of EMI/RFI by the traces on the top surface 15 of the PCB 20 is minimized by the secondary EMI/RFI shield, consisting of the hood 50 and the bezel 60 of FIG. 1. To ensure an electromagnetic "seal" between the PCB 20 and the hood 50, the periphery of the I/O zone 200 is outlined with a trace, by way of example trace 170. The trace 170 provides a means for grounding the hood 50 by being arranged and dimensioned to coincide with the bottom edge 59 of the hood, and particularly to make electrical contact with the fingers 54 of the hood 50 and thus ensuring electrical continuity of the secondary Faraday cage. The width of the trace 170 is in the range of about 0.180 to 0.200 inches (180 to 200 mils).

Figure 3:
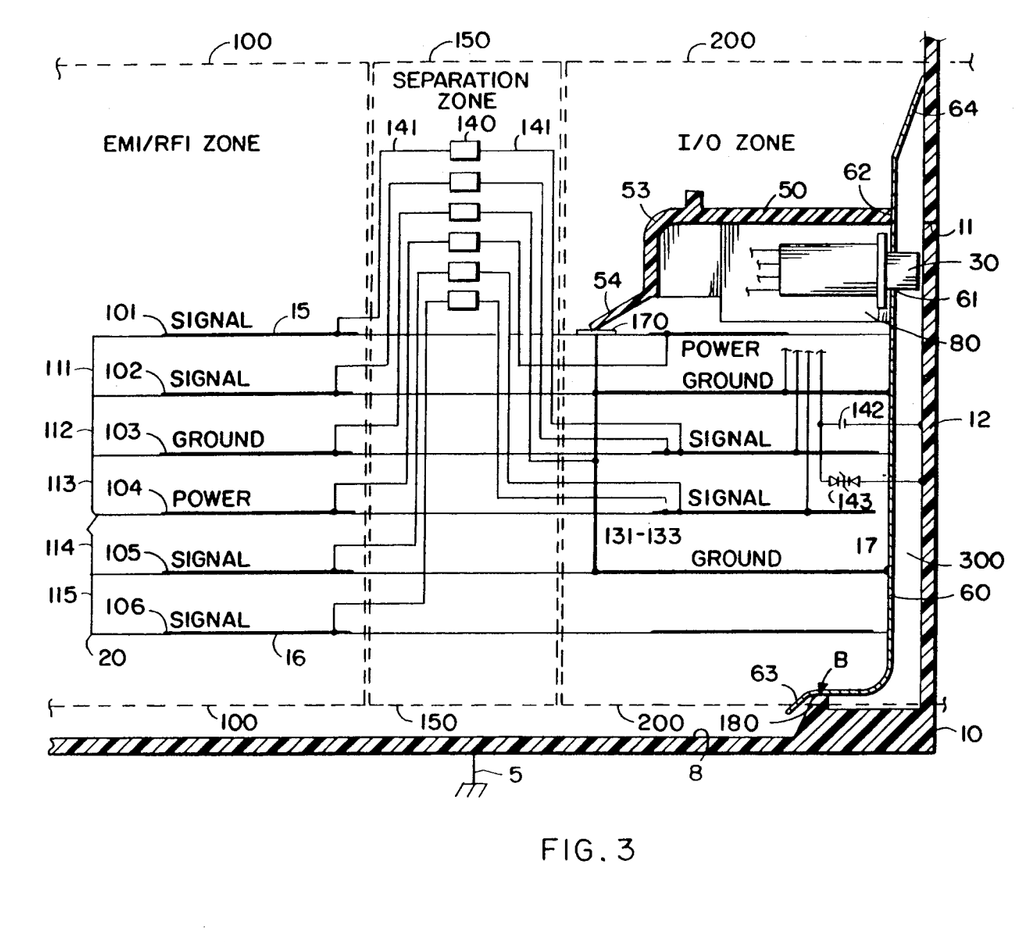
FIGS. 3, 4 and 5 are cross-sectional partially schematic views of six, eight and ten layer printed board variations of the system of FIG. 1, respectively, as viewed generally along line 2—2 thereof.
Figure 4:
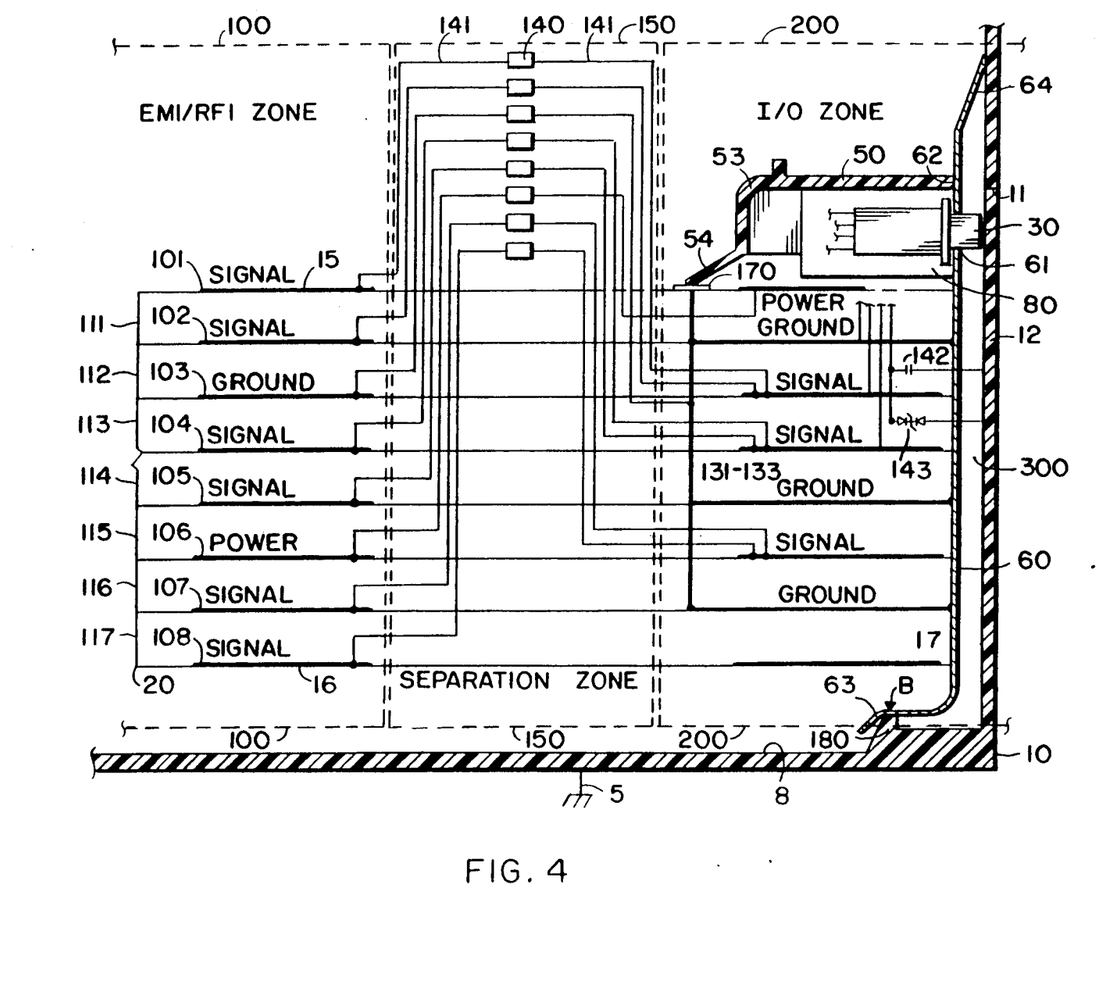
Figure 5:
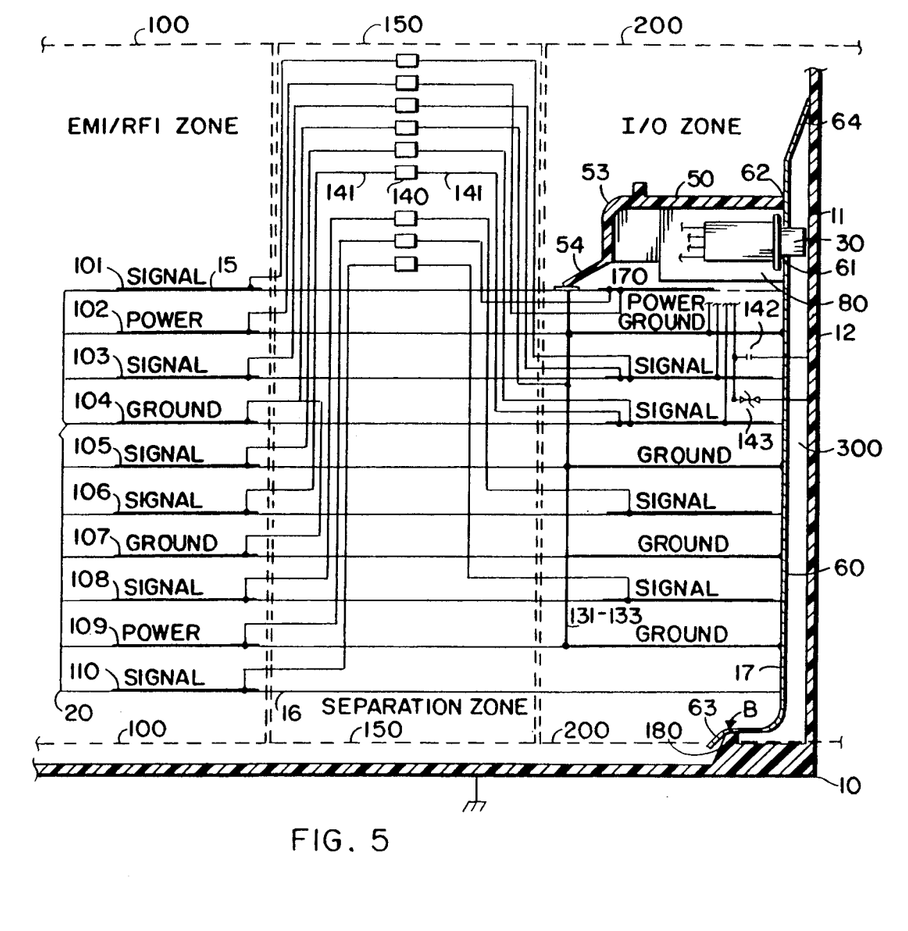

Now with reference to FIGS. 3, 4 and 5, the electrical relationships and functions of the chassis 10, the PCB 20 and the hood 50 and bezel 60 are further specified. FIGS. 3, 4 and 5, partially schematic, show the arrangements for a six, eight and ten layer printed circuit board respectively.

First with respect to FIG. 3, for a six layer PCB 20, there is shown, not to scale, the rear portion of the chassis 10. As previously explained, all interior and exterior surfaces of the chassis 10 are coated with an electrically conducting material electrically coupled to a ground 5. Other than access cut-outs 11 in the rear wall 12, the chassis 10 forms a continuous shell for enclosing the PCB 20 and the components mounted thereon.

Formed on the bottom interior surface 8 of the chassis 10 is a row of evenly spaced nubs 180 (see FIG. 6), one of which is shown in cross-section in the view of FIG. 3. The row of nubs 180 is arranged generally parallel to the rear wall 12 of the chassis 10, as shown in the view of FIG. 6.

Mounted near the bottom portion of the chassis 10 is the PCB 20. The PCB 20 is illustrated greatly magnified relative to the other portions of FIG. 3 and has five insulating layers 111-115 alternating with six conducting layers 101-106. The various traces 121-124 of FIG. 2 on the conducting layers 101-106 are generally represented schematically in FIG. 3 by thicker horizontal lines. The vias 130-133 of FIG. 3 coupling the traces 121-124 on the conducting layers 101-106 are generally represented schematically in FIG. 3 as vertical lines.

The hood 50 is positioned on the rear portion of the PCB 20, with the rear edge 62 of the hood 50 aligned with rear edge 17 of the PCB 20. The flexible fingers 54 projecting from the front wall 53 of the hood 50 are in contact with the trace 170.

The bezel 60 is mounted perpendicularly with respect to the plane of the PCB 20. The rear edge 17 of the PCB 20 and the rear edge 62 of the hood 50 are in contact with the bezel 60. The bezel is formed with a spring-like top lip 64 and bottom lip 63. The lips 63 and 64 are firmly pressed against interior surface of the chassis by the pressure of the PCB 20 and the hood 50. That is, the top line 64 contacts the interior surface of the rear wall of the chassis above cut-out 11 at "A" and the bottom lip 63 contacts the row of nubs 180 on the bottom of the chassis 10 at "B."

One of the I/O connectors 30 is shown in cross-section partially protruding through aperture 61 in bezel 60 and accessible through cut-out 11 in the chassis 10. The cross-sectional dimension of the aperture 61 is slightly larger than the cross-sectional dimensions of that portion of the I/O connector 30 protruding therethrough, providing for a close tolerance fit between the bezel 60 and the I/O connector 30. FIG. 3 also shows the filter circuits 140 mounted generally in the separation zone 150.

In a traditional multi-layer printed circuit board a conducting layer is generally dedicated to a single electrical function. In other words, the traces on a particular layer conduct generally one of power, ground or signal current. Also, in conventional PCB lay-out, the power, signal and ground planes extend generally throughout the entire plane of one of the particular conducting layers. Also, in a conventional PCB for high performance computer systems, the power, and ground layers re paced generally adjacently near the middle of the PCB 20. By placing the power and ground layers near the center of the PCB 20 it is easier to maintain a constant impedance with the signal layers. This placement of the layers also reduces heat transfer to the surfaces, 15 and 16, of the PCB 20 on which the various components are mounted.

According to the present invention, the arrangement and electrical function of the traces in the various conducting layers 101-106 in the EMI/RFI zone 100 are different from those in the I/O zone 200. In the EMI/RFI zone 100, the various conducting layers 101-106 are arranged generally conventionally. That is, the conducting layers 103 and 104 near the center of the PCB 20 are generally used for ground (GROUND) and power (POWER) traces, respectively. The remaining conducting layers 101, 102, 105 and 106 are generally used for signal (SIGNAL) traces.

However, in the I/O zone 200, the conducting layers 103 and 104 are for signal traces and are sandwiched between two conducting layers 102 and 105 which are used for ground traces. The conducting layers 102 and 105, coupled by the fence-like vias 131-133 of FIG. 2, form two ground planes for shielding the signal traces on conducting layers 103 and 104 from EMI/RFI. Furthermore, the conducting layer 101 on the top surface 15 of the PCB 20 in the I/O zone 200 is used generally for power traces (except for the previously described trace 170 for grounding the hood 50). In other words, in the I/O zone 200, the top surface 15, which is more susceptible to EMI/RFI, is not used for signal traces. As previously described, the bottom surface 16 of the PCB 20 in the I/O zone 200 does not contain any traces.

In the EMI/RFI zone 100 the ground traces in conducting layer 103 do not directly connect with chassis ground 5. Instead, the ground traces in the two zones 100 and 200 are coupled only through one of the filter circuits 140. That is, ground return for the various components in the EMI/RFI zone 100 is only by means of the various traces on the conducting layers 101-106 in the EMI/RFI zone 100. In other words, ground in the EMI/RFI zone 100, at EMI/RFI frequencies, "floats" with respect to ground in the I/O zone 200. Thus, the ground planes of the PCB 20 in the I/O zone 200 (layers 102 and 105) and chassis ground 5 are electrically isolated from electromagnetic noise present in the ground plane (layer 103) of the EMI/RFI zone 100, which may be as large as several hundred millivolts. This further improves the electromagnetic isolation of the I/O connectors 30.

Furthermore, the I/O connectors 30 are grounded by an electrostatic discharge charge circuit including a capacitor 142, for example 1000 picofarads 50 V, and transorb 143, for example a 8 V ziner diode. The capacitor 142 and transorb 143 are coupled in parallel between the I/O connectors 30 ground and the chassis 10. The transorb 143, which becomes non-conductive under conditions of high potential difference, protects the I/O connectors 30 from spurious electrostatic discharges.

The hood 50 and the bezel 60 as previously explained provide a secondary EMI/RFI shield which protects the I/O connectors 30 from near-field capacitive coupled electromagnetic radiation which may be present within the chassis 10 environment. The bezel 60 also minimizes EMI/RFI leakage into the cavity 300, formed between the bezel 60 and the rear wall 12, behind access cut-outs 11 in the rear wall 12 of the chassis 10.

FIGS. 4 and 5 show alternative lay-outs for an eight and ten layer printed circuit board. The arrangements of the signal, power and ground layers for the six, eight and ten layer PCB 20 shown in FIGS. 3, 4 and 5 are summarized in the following table.

| Layer | (FIG. 3) Six Layer EMI/RFI Zone 100 | I/O Zone 200 | (FIG. 4) Eight Layer EMI/RFI Zone 100 | I/O Zone 200 | (FIG. 5) Ten Layer EMI/RFI Zone 100 | I/O Zone 200 |
| --- | --- | --- | --- | --- | --- | --- |
| 101 | Signal | Power  | Signal | Power  | Signal | Power  |
| 102 | Signal | Ground | Signal | Ground | Power  | Ground |
| 103 | Ground | Signal | Ground | Signal | Signal | Signal |
| 104 | Power  | Signal | Signal | Signal | Ground | Signal |
| 105 | Signal | Ground | Signal | Ground | Signal | Ground |
| 106 | Signal | —      | Power  | Signal | Signal | Signal |
| 107 |        |        | Signal | Ground | Ground | Ground |
| 108 |        |        | Signal | —      | Signal | Signal |
| 109 |        |        |        |        | Power  | Ground |
| 110 |        |        |        |        | Signal | —      |

The detailed structure and operation of the secondary EMI/RFI shield is now described with reference to FIG. 6. In FIG. 6 there is shown the rear portion of chassis 10 with an access hole 11. On the interior bottom surface 8 of the chassis 10 is formed a row of spaced evenly nubs 180. The row of nubs 180 is positioned generally parallel and immediately adjacent to the rear wall 12 of the chassis 10.

Also shown in FIG. 6 is the PCB 20, with I/O connectors 30 mounted on the top surface 15 near the rear edge 17 of the PCB 20. The trace 170 defining the periphery of the I/O zone 200 is positioned on the top surface 15 of the PCB 20. A plurality of shaped generally oblong slots 57 are formed in the area of the I/O zone 200. The slots extend through the entire thickness of the PCB 20.

The hood 50 is formed with a top wall 51, two side walls 52 and a front wall 53. Projecting downward at an angle from the front wall 53 and along the entire length thereof, are a number of evenly spaced flexible fingers 54. The hood 50 also includes a plurality of internal vertical walls 55. Extending down, as viewed in FIG. 6, from the side walls 52 and some of the internal walls 55 are generally L-shaped tabs 56. The hood is dimensioned and arranged to cover the I/O components 30.

The bezel 60 is formed of a plate-like, generally rectangular shaped, electrically conducting metallic material. The bezel has a flexible bottom lip 63 and top lip 64. A plurality of apertures 61 are formed in the bezel 60 configured for receiving the rear portion of I/O connectors 30.

The hood is engaged with the PCB 20 by inserting the tabs 56 of the hood 50 into corresponding slots 57 of the PCB 20, as generally indicated by arrows "C" in FIG. 6. The hood 50 is then slid horizontally to engage the tabs 56 with the bottom surface 16. The bottom portion of the L-shaped tabs 55 when in contact with the bottom surface 16 of the PCB 20 firmly hold the hood 50 in place on the PCB 20. When the hood 50 is engaged with the PCB 20 the fingers 54 on the front of the hood 50 are in contact with the trace 170.

The bezel 60 is placed against the rear open face of the hood 50 and against the rear edge 17 of the PCB 20 as generally indicated by arrows "D" in FIG. 6. When thus positioned, a portion of the I/O connectors 30 protrude through the apertures 61 in the bezel 60. When the PCB 20 is inserted in the chassis 10, the bottom lip 63 of the bezel is in contact with the row of nubs 180 formed on the bottom 8 of the chassis 10 and the top lip 64 presses against the interior chassis 10 surface above access cut-outs 11 (as shown in FIG. 3).

The hood 50, the bezel 60 and PCB 20 when thus engaged with one another as indicated by arrows "C" and "D" and grounded by means of contact with the trace 170 and chassis 10 interior surfaces, form a plurality of Faraday cages separated by the internal walls 55, shielding the I/O connectors 30 from EMI/RFI present in the ambient environment inside chassis 10. The internal walls 55 reduce cross-talk interference between the various I/O connectors 30.

By integrating the lay-out of the PCB with filter circuits, grounding and, primary and secondary EMI/RFI shields, as disclosed herein, a high performance computer system can be constructed with a light-weight plastic enclosure and using low-cost, unfiltered and unshielded I/O connectors, yet minimizing excessive electromagnetic and radio frequency interference.

While the present invention has been shown and described with particularity to a preferred embodiment, it is to be understood by those skilled in the art that the foregoing and other changes in form and detail may be made therein without departing from the spirit and scope of the present invention.

What is claimed is:

1. An apparatus in a computer system for decreasing electromagnetic and radio frequency interference (EMI/RFI) radiation comprising:

a multi-layer printed circuit board (PCB) having alternating electrically insulating and electrically conducting layers, each of said electrically conducting layers including a plurality of electrically conducting pathways, said PCB partitioned into a first zone for mounting EMI/RFI radiating components, as second zone for mounting components sensitive to radiated EMI/RFI, and a third separation zone arranged between said first and second zones, said third zone having a vertically aligned area void of said electrically conducting pathways; and filtering means for electrically coupling said electrically conducting pathways in said first zone to said electrically conducting pathways in said second zone.

2. The apparatus according to claim 1 wherein said filtering means includes a ferrite bead and a capacitor.

3. The apparatus according to claim 1 further including a primary EMI/RFI shield consisting of a chassis having all interior and exterior surfaces coated with an electrically conducting material for enclosing said multi-layer PCB, said components, and said filtering means.

4. The apparatus according to claim 3 further including a secondary EMI/RFI shield mounted in said second zone for enclosing said EMI/RFI sensitive components, said secondary EMI/RFI shield electrically coupled to said chassis.

5. The apparatus according to claim 4 wherein said secondary EMI/RFI shield further includes a hood having all interior and exterior surfaces coated with an electrically conducting material and a metallic bezel electrically coupled to said hood and said chassis.

6. The apparatus according to claim 5 wherein said hood further includes two side walls, a front wall, a top wall, a plurality of internal walls, a plurality of tabs attached to said walls for engaging said hood with said multi-layer PCB, and wherein said walls partition said secondary EMI/RFI shield into a plurality of cavities for positioning said EMI/RFI sensitive components.

7. The apparatus according to claim 6 wherein said front wall further includes a plurality of spaced equally, flexible fingers for electrically coupling said hood with electrically conducting pathways for carrying ground currents on one of said conducting layers on a top surface of said multi-layer PCB.

8. The apparatus according to claim 5 wherein said bezel includes a flexible upper and lower lip for electrically coupling said bezel to said chassis.

9. The apparatus according to claim 5 wherein said bezel includes a plurality of apertures closely fitting some of said EMI/RFI sensitive components partially protruding therethrough.

10. The apparatus according to claim 4 wherein said secondary EMI/RFI shield consist of a hood, a bezel and some of said electrically conducting layers having electrically conducting pathways for carrying ground currents, said chassis, said hood, said bezel and said electrically conducting pathways for carrying ground currents electrically coupled to one and another.

11. The apparatus according to claim 1 wherein some of said EMI/RFI sensitive components mounted in said second zone are Input/Output (I/O) connectors for coupling said computer system with external I/O devices.

12. The apparatus according to claim 11 wherein said I/O connectors are electrically unshielded and electrically unfiltered.

13. The apparatus according to claim 1 wherein said electrically conducting pathways for conducting signal currents in said second zone are arranged on one of said electrically conducting layers which is between at least two other of said electrically conducting layers having electrically conducting pathways for carrying ground currents.

14. The apparatus according to claim 13 wherein said electrically conducting pathways in said electrically conducting layer for carrying ground currents are coupled with one another by means of vias spaced generally equally from one another.

15. The apparatus according to claim 14 wherein said vias are spaced closely for minimizing the amount of EMI/RFI radiation received by said electrically conducting pathways in said second zone.

16. The apparatus according to claim 13 wherein the bottom portion of said multi-layer PCB in said second zone is one of said plurality of insulating layers.

17. The apparatus according to claim 13 wherein the top portion of said multi-layer PCB in said second zone is one of said plurality of electrically conducting layers having electrically conducting pathways for carrying ground and power currents.

* * * * *